United States Patent [19]

Muto et al.

[11] Patent Number: 5,264,720
[45] Date of Patent: Nov. 23, 1993

[54] HIGH WITHSTANDING VOLTAGE TRANSISTOR

[75] Inventors: Hiroshi Muto, Kariya; Masami Yamaoka, Anjo, both of Japan

[73] Assignee: Nippondenso Co., Ltd., Kariya, Japan

[21] Appl. No.: 879,550

[22] Filed: May 4, 1992

Related U.S. Application Data

[63] Continuation of Ser. No. 585,798, Sep. 21, 1990, abandoned.

[30] Foreign Application Priority Data

Sep. 22, 1989 [JP] Japan .................................. 1-247372

[51] Int. Cl.⁵ ...................... H01L 27/01; H01L 29/76
[52] U.S. Cl. ..................................... 257/348; 257/409
[58] Field of Search .......................... 357/2, 4, 23.7; 257/348, 409

[56] References Cited

U.S. PATENT DOCUMENTS

| | | | |
|---|---|---|---|
| 4,393,577 | 12/1981 | Imai | 357/23.7 |
| 4,527,181 | 7/1985 | Sasaki | 357/23.7 |
| 4,623,908 | 11/1986 | Oshima et al. | 357/23.7 |
| 4,710,794 | 12/1987 | Koshino et al. | 257/502 |
| 4,755,482 | 7/1988 | Nagakubo | 357/23.7 |
| 4,803,530 | 2/1989 | Taguchi et al. | 357/23.7 |
| 4,851,363 | 7/1989 | Troxell et al. | 357/23.7 |
| 4,906,587 | 3/1990 | Blake | 357/23.7 |
| 4,907,041 | 3/1990 | Huang | 357/23.7 |
| 4,914,491 | 4/1990 | Vu | 357/23.7 |
| 4,965,872 | 10/1990 | Vasudev | 357/23.7 |
| 4,969,023 | 11/1990 | Svedberg | 357/23.7 |
| 4,974,041 | 11/1990 | Grinberg | 357/23.7 |
| 4,996,575 | 2/1991 | Ipri et al. | 357/23.7 |
| 5,027,177 | 6/1991 | Vasudev | 357/23.7 |
| 5,066,993 | 11/1991 | Miura et al. | 357/23.7 |
| 5,072,277 | 12/1991 | Sakakibara et al. | 357/23.7 |

FOREIGN PATENT DOCUMENTS

| | | | |
|---|---|---|---|
| 61-59852 | 3/1966 | Japan | . |
| 54-382 | 1/1979 | Japan | 357/23.7 |
| 56-164568 | 12/1981 | Japan | 357/23.7 |
| 57-10267 | 1/1982 | Japan | 357/23.7 |
| 60-92653 | 5/1985 | Japan | 357/23.7 |
| 61-278164 | 12/1986 | Japan | 357/23.7 |
| 63-43375 | 2/1988 | Japan | 357/41 |
| 63-53967 | 3/1988 | Japan | 357/47 |
| 63-65641 | 3/1988 | Japan | 357/47 |
| 63-142851 | 6/1988 | Japan | 357/42 |
| 63-173369 | 7/1988 | Japan | 357/23.7 |

OTHER PUBLICATIONS

IEEE Transactions on Electron Device, vol. 38, No. 1, Jan. 1991, "A High-Voltage Polysilicon TFT with Multigate Structures" by Vemoto et al., pp. 95-99.

Japanese Patent Application Lai-Open SDM 88-168 pp. 49-56, "On Resistance of High Voltage SOI-MOSFET's", by Sasaki et al.

*Primary Examiner*—Rolf Hille
*Assistant Examiner*—Steven Loke
*Attorney, Agent, or Firm*—Cushman, Darby & Cushman

[57] ABSTRACT

A high withstanding voltage transistor is provided with a substrate with its main surface at least part of which is electrically insulated, and a plurality of MOS type field effect transistors of the same channel type that are formed on the insulated main surface of the substrate, the channel regions of the number of MOS type field effect transistors are electrically separated respectively, the gates of the plurality of MOS type field effect transistors are mutually connected electrically, between and among the plurality of MOS type field effect transistors, the source of one transistor is connected to the drain of another transistor, and connecting in series the plurality of MOS type field effect transistors, they are made into a single transistor, thereby dividing the voltage applied in between the drain and the source of this high withstanding voltage transistor with depletion layer of the respective transistors and in turn improving the withstanding voltage of the whole.

9 Claims, 5 Drawing Sheets

HIGH WITHSTANDING VOLTAGE TRANSISTOR

This is a continuation of Application No. 07/585,798, filed on Sep. 12, 1990 now abandoned.

BACKGROUND OF THE INVENTION

The present invention relates to SOI type (or SOS type) MOS (metal oxide semiconductor) - type transistors with high withstanding voltage.

Offset gate type transistors have been known so far as MOS type transistors provided with high withstanding voltage. Such offset gate type transistor is one to which a lightly doped drain layer having a low impurity concentration and the same conductive type as that of a drain layer has been additionally provided between the drain and the source by ion implantation or the like.

This lightly doped drain layer having a low concentration causes the depletion layer developed while drain voltage is being applied to spread toward the source side, thus diminishing the field strength and contributing to providing with high withstanding voltage. The lightly doped drain layer having a low concentration furthermore serves as a pinch resistance layer, thus allowing the electric current passing across the channel region to flow to the drain electrode by way of this layer.

However, for the reason that the above-mentioned offset gate type transistor forms the lightly doped drain layer having a low impurity concentration separate from a drain layer, one extra mask is required for establishing the lightly doped drain layer having a low impurity concentration, resulting in a drawback that this will mean one additional step to the manufacturing process.

SUMMARY OF THE INVENTION

The object of the present invention is to obtain the transistor provided with high withstanding voltage without increasing the steps of manufacture.

To accomplish the aforesaid object, the high withstanding voltage transistor of the present invention.

Includes a substrate having a main surface at least part of which is electrically insulated, and a plurality of MOS type field effect transistors having same conductive type channel regions, sources, drains, and gates, and formed on the insulated main surface of the substrate, wherein the channel regions of the transistors are mutually separated electrically, the gates of the transistor are mutually connected electrically, and the source of one transistor of the transistors is electrically connected to the drain of another transistor of the transistors so that the plurality of MOS type field effect transistors are connected in series to be made into a single transistor.

According to the present invention, as voltage is applied between the drain and source of the transistors that have been made into one, the voltage present in between is divided by each depletion layer formed in each PN junction between the drain and channel of the transistors that make up the respective portions of the transistor.

The sum of the withstanding voltages across the respective depletion layers, therefore, constitutes the withstanding voltage of the whole transistors, thus enhancing the withstanding voltage of the whole.

The magnitude of the withstanding voltage can, furthermore, can be changed depending on the number of transistors that make up each portion.

DESCRIPTION OF THE PREFERRED EMBODIMENTS

The present invention will be described with reference to the the preferred embodiments.

Embodiment No. 1

Figure 1:
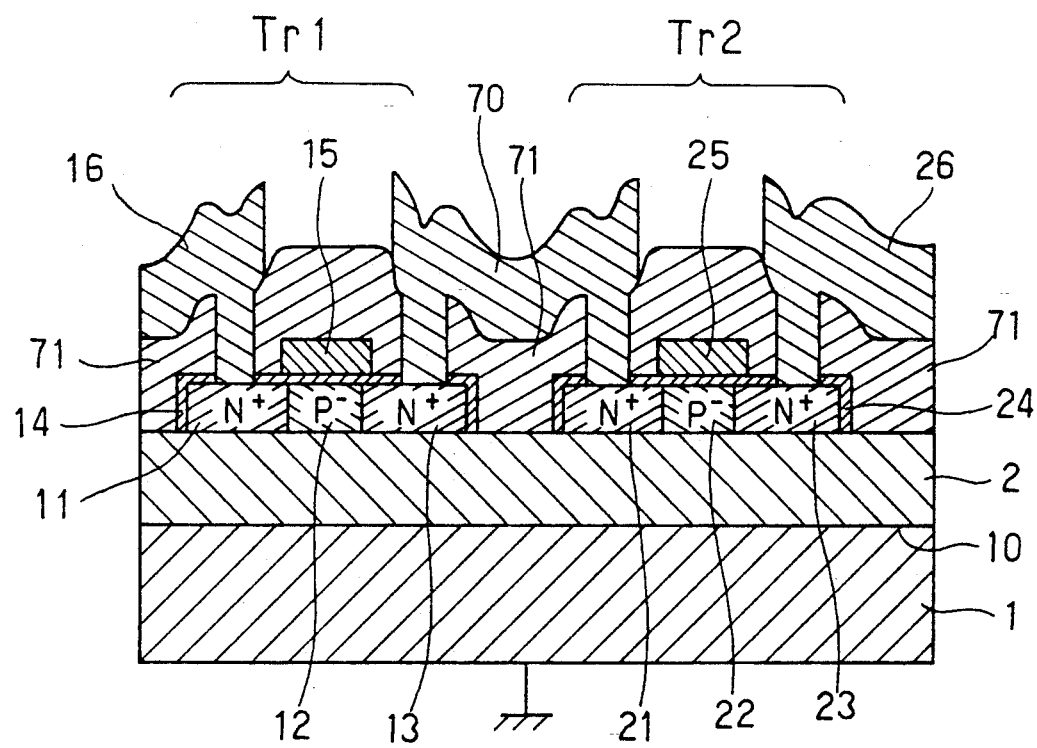
FIG. 1 is a cross sectional view illustrating the structure of a high withstanding voltage transistor relating to a specific embodiment of the present invention.

In FIG. 1, main surface 10 of silicon substrate 1 is oxidized by thermal oxidation, and first insulation film 2 consisting of $SiO_2$ is formed. On this first insulation film 2 are formed drain 11 of n type high concentration region, channel region 12 of p type low concentration, source 13 of n type high concentration region, drain 21 of n type high concentration area, channel region 22 of p type low concentration, and source 23 of n type high concentration region. Further, they are covered with second insulation films 14 and 24 that constitute a gate oxide film which is composed of $SiO_2$. On second insulation films 14 and 24 on channel regions 12 and 22, furthermore, are formed gates 15 and 25 consisting of polycrystalline silicon that contains high concentration of n type impurities.

In this way, first transistor Tr1 is constituted with drain 11, channel region 12, source 13 and gate 15, and second transistor Tr2 is constituted with drain 21, channel region 22, source 23 and gate 25.

Source 13 of first transistor Tr1 and drain 21 of second transistor Tr2 are connected with conductive wiring 70 which is composed of aluminum. Moreover, gate 15 of first transistor Tr1 and gate 25 of second transistor Tr2 are connected with a conductive wiring made of aluminum in an area which is not shown in the drawing.

In this embodiment, first transistor Tr1 and second transistor Tr2 are thus connected in series, with conductive wiring 16 being connected to drain 11 of first transistor Tr1, and conductive wiring 26 to source 23 of second transistor Tr2. The whole consisting of two connections in series can therefore be regarded as one transistor, and in such a case, drain 11 of first transistor Tr1 is regarded the drain of the transistor as the whole, and source 23 of second transistor Tr2 is regarded the source of the transistor as the whole. 71 is an interlayer film.

Figure 2:
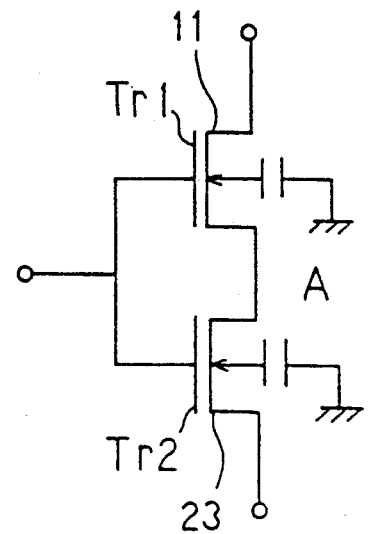
FIG. 2 is a circuit diagram showing the equivalent circuit of the transistor of the embodiment shown in FIG. 1.

An equivalent circuit of transistor of such composition will be illustrated in FIG. 2. Both channel regions 12 and 22 are floated electrically.

In such a transistor, the electric potential across channel region 12 will also rise by applying a higher voltage to drain 11 while keeping the voltage across silicon substrate 1 and source 23 at zero. This is because channel region 12 is in a floated state where no electric potential is directly applied and is strongly affected by the electric potential applied by way of the adjacent junction or oxide film. With source 13 of transistor Tr1 also being in a floated state, the potential across its source 13 goes up too as the potential across channel region 12 is increased. Since drain 21 of transistor Tr2 is directly connected with source 13 of transistor Tr1 electrically, the potential across drain 21 will consequently rise to the level of the potential across source 13. Since channel region 22 of transistor Tr2, too, is in a floated state, the potential across channel region 22 will rise also.

Because PN junction is provided between drain 11 and channel region 12 and between drain 21 and channel region 22, and because this junction is reverse biased, the potential in between the two will be the largest in its potential fall. The voltage between drain 11 and source 23 will therefore be divided across those two reverse biased junction layers, thus bringing the electric potential across contact point A between transistor Tr1 and transistor Tr2 to a half that across channel region 12. This therefore means that a voltage being up to two times the voltage to which the transistors Tr1 and Tr2 can withstand, can be applied between drain 11 and source 23, making it possible to improve two-fold the withstanding voltage of the whole which can be regarded as one transistor.

Figure 3:
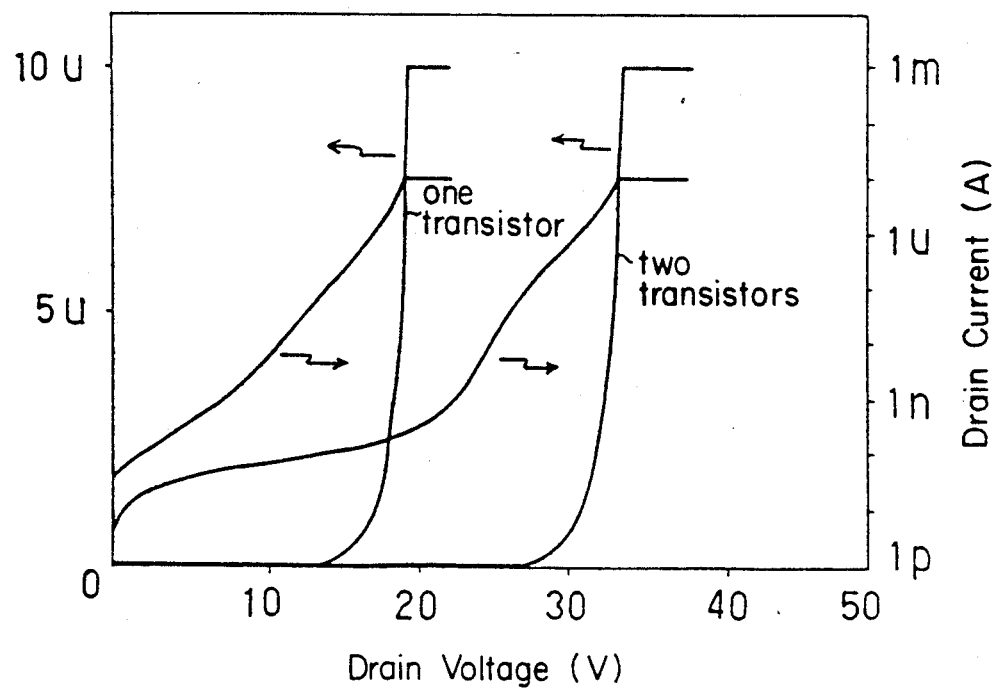
FIG. 3 is a graph of characteristics showing the characteristics of withstanding voltage measured of the transistor of the embodiment.

The relationship between drain voltage and drain current was measured by use of a transistor consisting of two transistors of the same structure that are connected in series and one transistor. The results of the measurement are given in FIG. 3. As evident from this figure, in the case of transistor that has been formed by connecting two in series according to the present invention, the with standing voltage thus obtained was two times that of one transistor alone.

Embodiment No. 2

Figure 4:
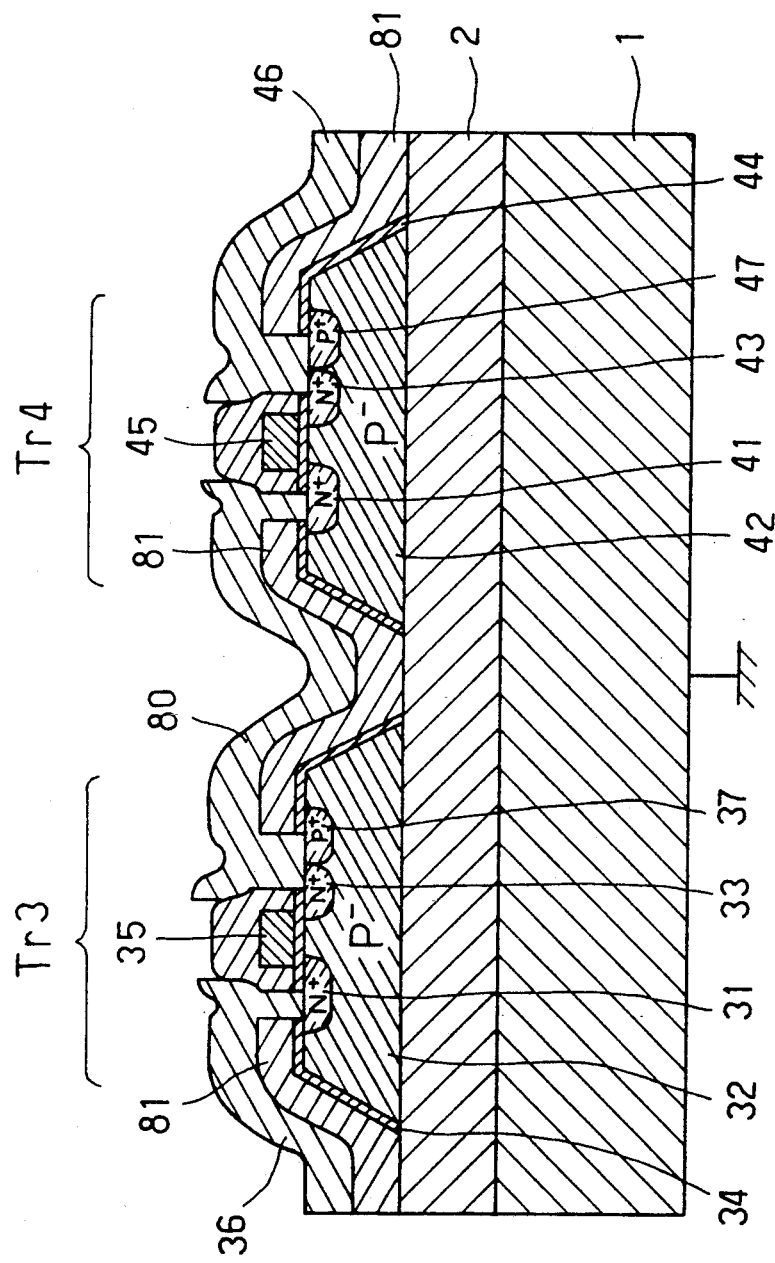
FIG. 4 is a cross sectional view illustrating the structure of a high withstanding voltage transistor relating to another embodiment.

In FIG. 4, silicon substrate 1 and first insulation film 2 are the same as in embodiment 1.

Over first insulation film 2 are formed channel regions 32 and 42, which are p type low concentration well regions. Channel regions 32 and 42 are covered with second insulation films 34 and 44 that are composed of $SiO_2$, and channel regions 32 and 42 are totally separated electrically. In channel region 32 are formed, in insular fashion, drain 31 of n type high concentration range and source 33 of n type high concentration range, and outside source 33 is formed contact region 37 of p type high concentration range, and in channel region 42 are similarly formed, in insular fashion, drain 41 of n type high concentration range and source 43 of n type high concentration range, and outside source 43 contact region 47 is formed as well. Those contact regions 37 and 47 are for forming an ohmic contact between sources 33 and 43 channel regions 32 and 42. Furthermore, in the channel regions 32 and 42 of second insulation films 34 and 44 composing the gate oxide films the gates 35 and 45 that are composed of polycrystalline silicon with a high content of n type impurities are formed.

In this way, transistor Tr3 is composed of drain 31, channel region 32, source 33, contact region 37 and gate 35, and transistor Tr4 is composed of drain 41, channel region 42, source 43, contact region 47 and gate 45.

Furthermore just as in embodiment 1, gate 35 and gate 45 are electrically connected with a conductive wiring in an area not shown in the drawing, and source 33 of transistor Tr3 is connected to drain 41 of transistor Tr4 across conductive wiring 80. Furthermore, conductive wiring 36 is connected to drain 31 and contact region 47 of transistor Tr3, and conductive wiring 46 is connected to source 43 and contact region 47 of transistor Tr4. 81 is an inter-layer film.

Figure 5:
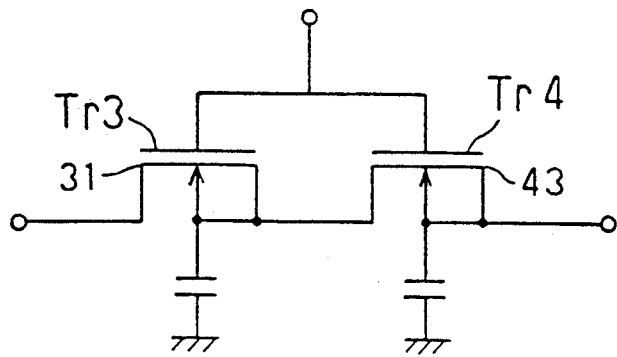
FIG. 5 is a circuit diagram showing the equivalent circuit of the transistor of the embodiment shown in FIG. 4.

An equivalent circuit of the transistor is that have been connected in series is illustrated in FIG. 5.

The same as in embodiment 1, channel region 32 of transistor Tr3 and channel region 42 of transistor Tr4 are completely separated with first insulation film 2, second insulation films 34 and 44 and a potential barrier consisting of PN junction between drain 41 and channel region 42. The voltage applied to the transistors Tr3 and Tr4 is therefore one half that applied between drain 31 and source 43, indicating that the withstanding voltage is improved two-fold.

Embodiment No. 3

Figure 6:
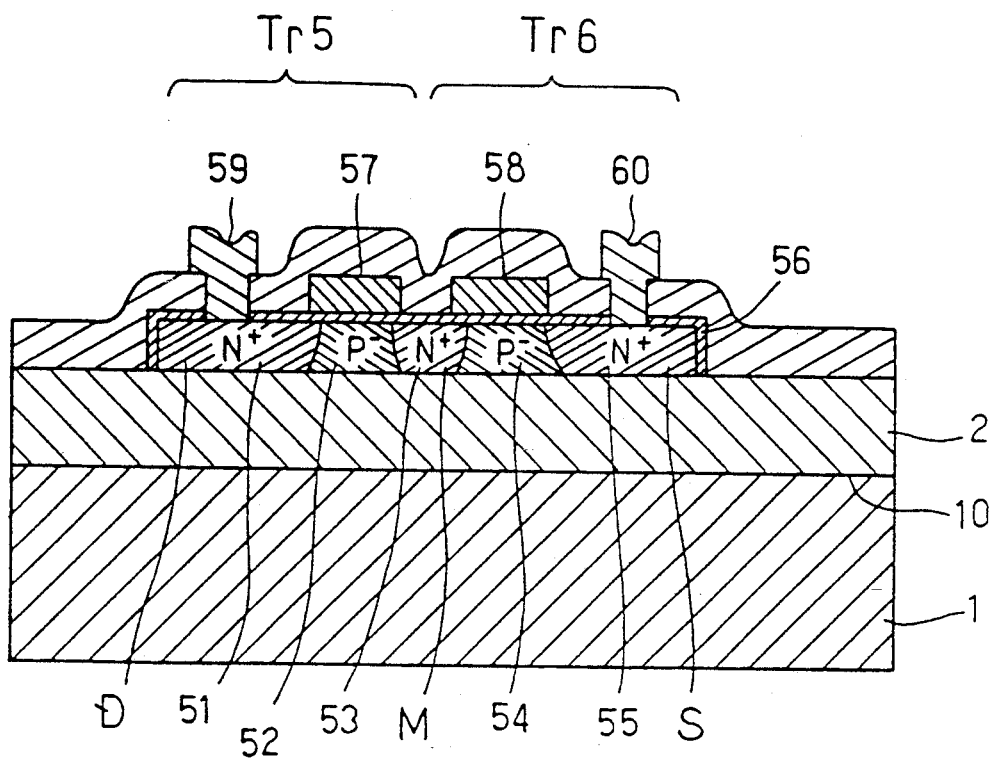
FIG. 6 is a cross sectional view illustrating the structure of a high withstanding voltage transistor of another embodiment.

In FIG. 6 first insulation film 2 formed on silicon substrate 1 and main surface 10 is the same as in embodiment No. 1.

On first insulation film are alternately formed n type high concentration regions 51, 53 and 55, and channel regions of p type low concentration 52 and 54 in a periodic pattern and in a horizontal direction. Their side and top faces are completely covered with second insulation film 56 that makes up gate oxide film, thus completely separating them electrically from the circuits, etc. that are formed on the other portions on silicon substrate 1. On second insulation film 56 over channel regions 52 and 54 are formed gates 57 and 58 and those gates 57 and 58 are mutually connected in an area that is not shown in the drawing. Furthermore, to n type high concentration region 51 is connected conductive wiring 59, and conductive wiring 60 is connected with n type high concentration region 55.

In the case of transistors of such structure, n type high concentration region 51 positioned at one end of the periodic pattern will be drain D, and n type high concentration region 55 at the other end of the periodic pattern will be source S, and n type high concentration region 53 will be intermediate electrode M. Furthermore, transistor Tr5 is composed of drain D, channel region 52, intermediate electrode M and gate 57, whereas transistor Tr6 is composed of intermediate electrode M, channel region 54, source S and gate 58.

A transistor of this configuration, therefore, can be regarded as one of series connection between transistors Tr5 and Tr6, and its equivalent circuit will be the same as the circuit appearing in FIG. 2.

The same as the preceding two embodiments, in this embodiment too, channel region 52 of transistor Tr5 and channel region 54 transistor Tr6 are completely separated from first insulation film 2, second insulation film 56 and a potential barrier of PN junction consisting of intermediate electrode M and channel region 54 that have been reverse biased. The voltage applied to transistors Tr5 and Tr6, therefore, is one half the voltage applied in between drain D and source S, with the result that the dielectric strength is improved two-fold.

In this embodiment, for the purpose of obtaining an equivalent circuit being similar to that shown in FIG. 5, p type high concentration region may be formed in part of the contact region between channel region 52 and intermediate electrode M or in part of the contact region between channel region 54 and source S, so that electric connection in both ways may be obtained between channel region 52 and intermediate electrode M and between channel region 54 and source S.

In this embodiment, the source and the drain of a transistor that are adjacent to each other, are made into one to be intermediate electrode M, and thus integration of elements can be achieved.

Further, a periodic pattern of arrangement of high concentration regions and channel regions, can be either a rectangular arrangement as shown in the drawing or a concentric arrangement of rectangular or circular form.

Embodiment No. 4

Figure 7:
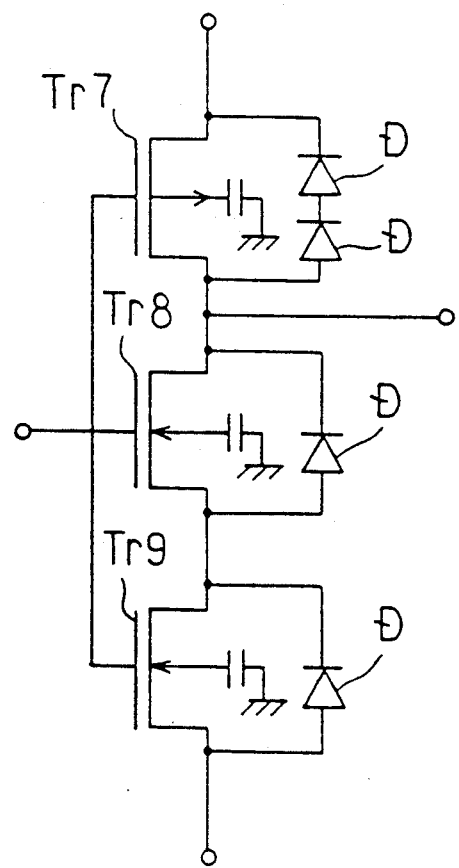
FIG. 7 is a circuit diagram showing the structure of a high withstanding voltage transistor relating to another embodiment; and, FIG. 8 is a cross sectional view illustrating the structure of a high withstanding voltage transistor relating to another embodiment.

Illustrated in FIG. 7 is mutually complementary type inverter. Transistor Tr7 is an offset gate type p channel transistor, whereas transistors Tr8 and Tr9 are n channel transistors of the structure illustrated in FIG. 1. Being configured as offset gate, p channel transistor serves to improve the withstanding voltage, whereas n channel transistor is for improving the withstanding voltage when connected in series. In the case of this structure, because p type low concentration offset region can be formed by means of ion implantation over the whole area without having to use a mask, the manufacturing procedure is simple and easy, and the area of the element can be small, too.

Diode d inserted in between the source and drain of each transistor for protective purpose, can also be used to make up an SOI layer.

Embodiment No. 5

Figure 8:
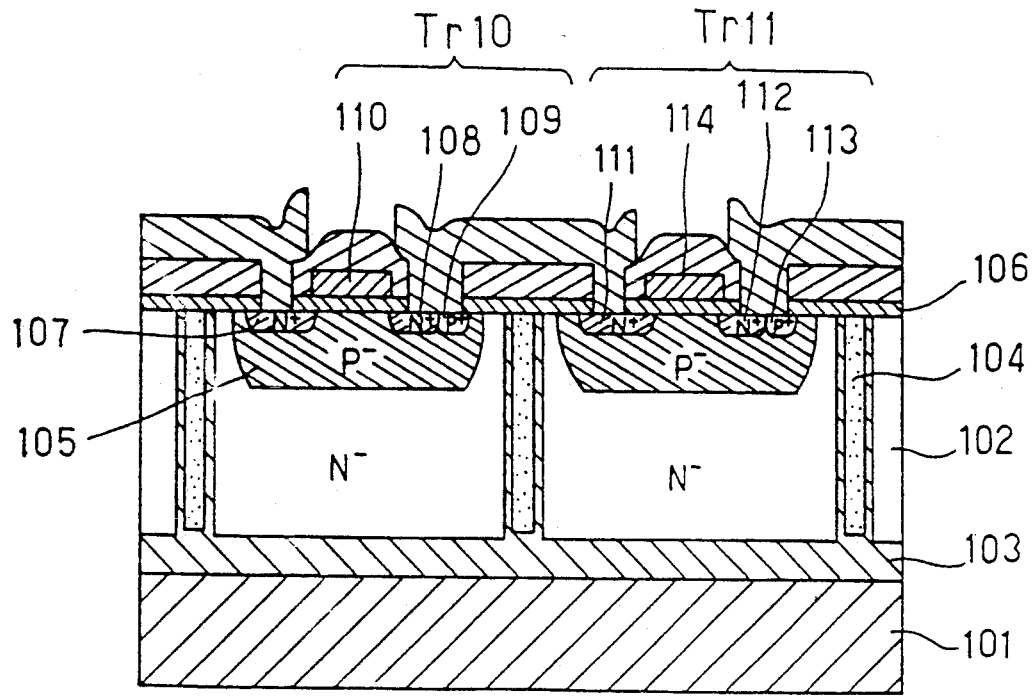

FIG. 8 shows the embodiment utilizing so called the direct bonding method. Firstly take two silicon wafers 101 and 102 and directly bond them together using oxide film 103 placed in between. Then, grind off silicon wafer 102 to the prescribed thickness (by approximately 1 to 10 $\mu$m), provide a trench groove as far as oxide film 103 in silicon wafer 102 by means of dry etching or the like, oxidize its side walls, fill the groove up with polycrystalline silicon 104, and then flatten and smoothen the surface by the etch back method. In this process, the respective areas where elements are expected to be formed are insulated and separated.

The technology for directly bonding silicon wafers is described for instance in U.S. Pat. No. 4,710,794, Japanese Patent Application Laid Open No. 59852-1986, etc.

Then, using a conventional process for MOSFET formation, tenth transistor Tr10 and eleventh transistor Tr11 are formed respectively in regions where insulated and separated elements are expected to be formed. In FIG. 8, symbols 105 and 106 represent p type well regions, 107, 108, 109 and 110 respectively represent drain, source, contact region and gate tenth transistor Tr10, and 111, 112, 113 and 114, respectively represent drain, source, contact region and gate of eleventh transistor Tr11.

In this embodiment, the effects to be described in the following can be obtained, in addition to that the withstanding voltage of the whole transistors that are regarded as one transistor can be improved two-fold as described in the above-mentioned embodiment.

(1) Since the area for forming elements in is a perfect single crystal, the performance of the transistor is equivalent to that of the transistor that has been conventionally formed in bulk.

(2) Since separation is made using a trench, the size of the area for separation is limited.

(3) The surface of the element is flat.

In all the foregoing embodiments, the number of transistors that make up the respective portions is arbitrary, and depending on the number of transistors to be connected in series, the withstanding voltage of all the transistors that are considered to be one can arbitrarily change.

The substrate in use is a silicon substrate, and an insulation film was formed by oxidizing the main surface of the substrate by thermal oxidation, but it is also possible to form a transistor by use of an insulation substrate consisting of sapphire of the like.

The conductivity type of the channel of the transistor can be either P type or N type.

What is claimed is:

1. A high withstanding voltage transistor comprising:
a substrate;
an insulating film formed on said substrate;
a plurality of MOS type field effect transistors having same conductivity type channel regions, sources, drains and gates, and formed on said insulating film;
channel region separating means for electrically separating said channel region of one of said transistors from said channel region of another of sad transistors;
gate connecting means for electrically connecting said gate of one of said transistors to said gate of another of said transistors so that said gates are connected in common;
series connecting means for electrically connecting said source of one of said transistors to said drain of another of said transistors so that said plurality of MOS type field effect transistors are connected in series and used as a single transistor; and
potential setting means for setting a potential of said substrate at a predetermined voltage and for biasing each of the channel region potentials in common through said insulating film, to operate said insulating film as a capacitor for absorbing electric noise.

2. A high withstanding voltage transistor according to claim 1, wherein said channel region separating means includes another insulating film which covers a surface of each channel region of said transistors.

3. A high withstanding voltage transistor according to claim 1, wherein said gate connecting means includes conductive wiring.

4. A high withstanding voltage transistor according to claim 1, wherein said series connecting means includes conductive wiring.

5. A high withstanding voltage transistor comprising:
a substrate;
an insulating film formed on said substrate;
a plurality of MOS type field effect transistors having same conductivity type channel regions, sources, drains and gates, and formed on said insulating film;
separating means for electrically separating one of said transistors from another of said transistors;

gate connecting means for electrically connecting said gate of said one of said transistors to said gate of said another of said transistors;

series connecting means for electrically connecting said source of said one of said transistors to said drain of said another of said transistors so that said plurality of MOS type field effect transistors are connected in series and used as a single transistor; and potential setting means for setting a potential of said substrate at a predetermined bias voltage to operate said insulating film as a capacitor for absorbing electric noise.

6. A high withstanding voltage transistor according to claim 5, wherein said separating means includes an insulating film which covers a surface of each channel region of said transistors.

7. A high withstanding voltage transistor according to claim 5, wherein said gate connecting means includes conductive wiring.

8. A high withstanding voltage transistor according to claim 5, wherein said series connecting means includes conductive wiring.

9. A high withstanding voltage transistor device comprising:

a substrate;

a film insulating film formed on said substrate;

a plurality of high impurity concentration regions formed on said first insulating film in a predetermined interval pattern;

a plurality of channel regions formed between said high impurity concentration regions so that one of said channel regions is separated from another of said channel regions by at least one of said high impurity concentration regions;

a second insulating film formed on said high impurity concentration regions and said channel regions;

a plurality of gates formed on said second insulating film across said channel regions; and potential setting means for setting a potential of said substrate at a predetermined bias voltage to operate said insulating film as a capacitor for absorbing electric noise;

whereby one end of said high impurity concentration region pattern operates as a drain of said transistor device and the other end of said high impurity concentration region pattern operates as a source of said transistor device.

* * * * *